US011710708B2

(12) United States Patent
DeJarld et al.

(10) Patent No.: US 11,710,708 B2
(45) Date of Patent: Jul. 25, 2023

(54) ON-CHIP EMF ISOLATION OF AN INTEGRATED CIRCUIT COUPLED WITH PHOTOCONDUCTIVE SEMICONDUCTOR SWITCH UNDER AN ON-CHIP FARADAY CAGE

(71) Applicant: Raytheon Company, Waltham, MA (US)

(72) Inventors: Matthew DeJarld, Wakefield, MA (US); Jeffrey R. LaRoche, Lowell, MA (US); Susan C. Trulli, Lexington, MA (US)

(73) Assignee: RAYTHEON COMPANY, Waltham, MA (US)

( * ) Notice: Subject to any disclaimer, the term of this patent is extended or adjusted under 35 U.S.C. 154(b) by 114 days.

(21) Appl. No.: 17/406,541

(22) Filed: Aug. 19, 2021

(65) Prior Publication Data
US 2023/0056601 A1    Feb. 23, 2023

(51) Int. Cl.
*H01L 23/552*    (2006.01)
*H01L 27/144*    (2006.01)

(52) U.S. Cl.
CPC .......... *H01L 23/552* (2013.01); *H01L 27/144* (2013.01)

(58) Field of Classification Search
CPC . H01L 23/552; H01L 27/144; H01L 31/1035; H01L 31/02019; H01L 27/14–14893; H01L 31/0304–03048; H01L 31/184–1856; H01L 21/02378; H01L 29/1608; H01L 29/1604; H01L 29/161–167; H01L 21/0445–0495; H01L 29/66053–66068
USPC .................................................. 257/76, 431
See application file for complete search history.

(56) References Cited

U.S. PATENT DOCUMENTS

| 4,939,375 | A | 7/1990 | Walters et al. |
|---|---|---|---|
| 6,864,484 | B1 * | 3/2005 | Zur ................... H01L 27/14676 |
| | | | 257/E27.146 |
| 7,009,195 | B2 | 3/2006 | Nakano et al. |
| 7,834,456 | B2 | 11/2010 | Tabatabaie et al. |
| 7,994,550 | B2 | 8/2011 | Kaper et al. |
| 7,999,358 | B2 | 8/2011 | Bakalski et al. |

(Continued)

FOREIGN PATENT DOCUMENTS

| EP | 0235029 A1 | 9/1987 |
|---|---|---|
| WO | 2017/142978 A1 | 8/2017 |

OTHER PUBLICATIONS

International Search Report and Written Opinion dated Dec. 6, 2022 in counterpart International Appln. No PCT/US2022/040735.

(Continued)

*Primary Examiner* — Didarul A Mazumder

(74) *Attorney, Agent, or Firm* — Bachman & LaPointe, P.C

(57) ABSTRACT

An integrated circuit structure including a substrate having an upper surface; a gallium nitride layer disposed on the upper surface of the substrate; and a photoconductive semiconductor switch laterally disposed alongside a transistor on the gallium nitride layer integrated into the integrated circuit structure; an EMF shield enclosing the substrate, the gallium nitride layer and the photoconductive semiconductor switch laterally disposed alongside the transistor on the gallium nitride layer integrated into the integrated circuit structure; and a signal line electronically coupled with the photoconductive semiconductor switch, the signal line penetrating the EMF shield.

19 Claims, 1 Drawing Sheet

(56) References Cited

U.S. PATENT DOCUMENTS

| | | |
|---|---|---|
| 8,049,119 B2 | 11/2011 | Beddingfield et al. |
| 8,154,432 B2 | 4/2012 | Kaper et al. |
| 8,212,294 B2 | 7/2012 | Hoke et al. |
| 8,466,555 B2 | 6/2013 | Chelakara et al. |
| 8,575,666 B2 | 11/2013 | LaRoche et al. |
| 8,665,013 B2 | 3/2014 | Saunders |
| 8,669,646 B2 | 3/2014 | Tabatabai et al. |
| 8,823,146 B1 | 9/2014 | Hoke |
| 8,853,745 B2 | 10/2014 | Tabatabaie et al. |
| 9,147,701 B2 | 9/2015 | Saunders |
| 9,154,045 B2 | 10/2015 | Saunders et al. |
| 9,331,153 B2 | 5/2016 | LaRoche |
| 9,356,045 B2 | 5/2016 | Comeau et al. |
| 9,419,125 B1 | 8/2016 | Schultz et al. |
| 9,478,508 B1 | 10/2016 | LaRoche et al. |
| 9,761,445 B2 | 9/2017 | LaRoche et al. |
| 10,096,550 B2 | 10/2018 | LaRoche et al. |
| 10,224,285 B2 | 3/2019 | LaRoche et al. |
| 2013/0074907 A1* | 3/2013 | Saunders ............... H01L 27/142 136/249 |
| 2015/0131685 A1* | 5/2015 | Schiffrin ........... H01L 31/03044 372/30 |
| 2019/0237552 A1 | 8/2019 | LaRoche |
| 2019/0237554 A1 | 8/2019 | LaRoche et al. |
| 2019/0277981 A1* | 9/2019 | Shimizukawa ......... G01T 1/208 |
| 2021/0091242 A1 | 3/2021 | Makurin et al. |
| 2021/0098285 A1 | 4/2021 | LaRoche et al. |

OTHER PUBLICATIONS

Andrew D. Koehler et al. "High Voltage GaN Lateral Photoconductive Semiconductor Switches", ECS Journal of Solid State Science and Technology, vol. 6, No. 11, Jan. 1, 2017, pp. S3099-S3102, XP055930756, US.

* cited by examiner

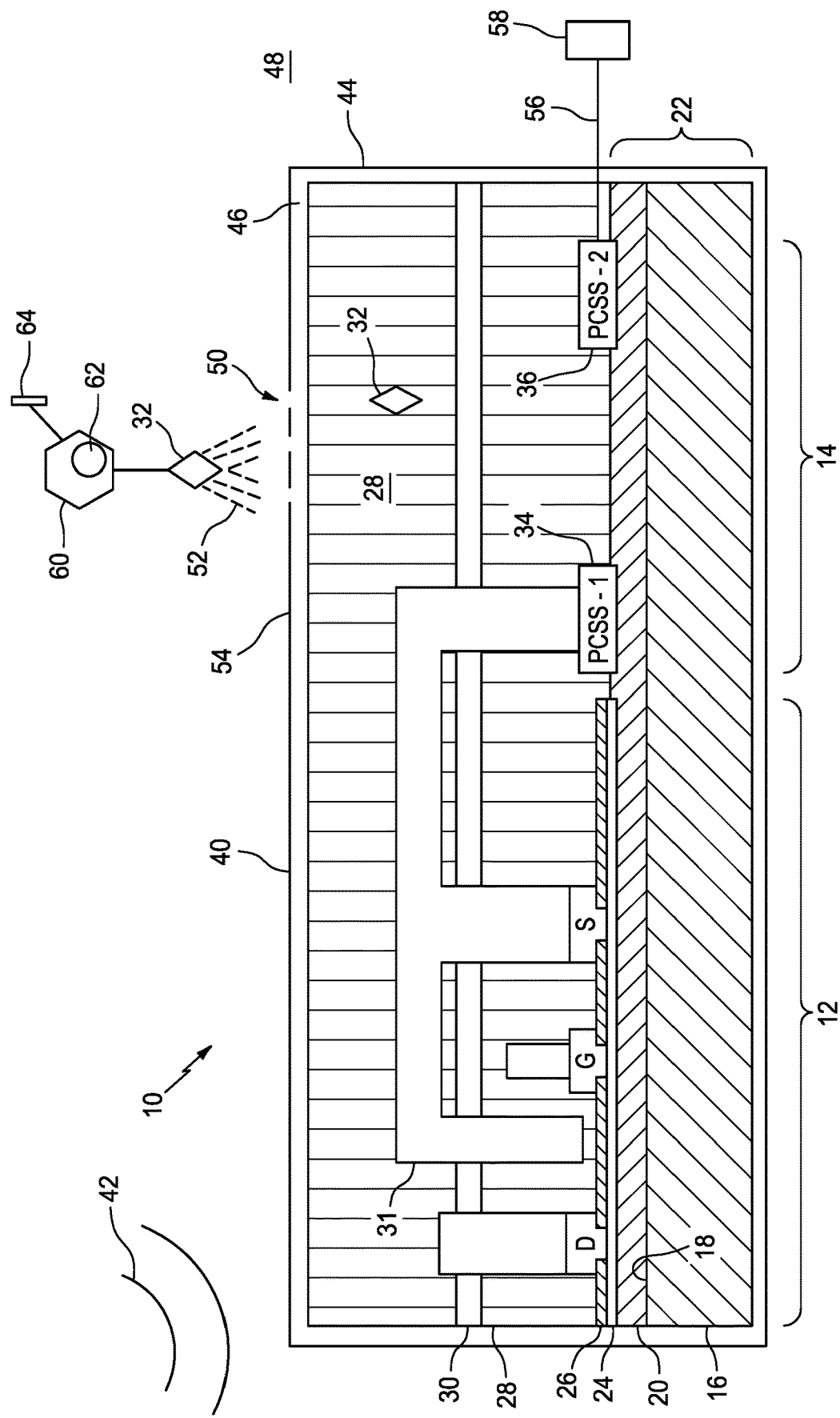

ON-CHIP EMF ISOLATION OF AN INTEGRATED CIRCUIT COUPLED WITH PHOTOCONDUCTIVE SEMICONDUCTOR SWITCH UNDER AN ON-CHIP FARADAY CAGE

BACKGROUND

The present disclosure is directed to electromagnetic field (EMF) protection for integrated circuit technology, particularly, a structure that includes a conductive EMF shield for both GaN photoconductive semiconductor switch (PCSS) and/or photoconductively switched transistor and GaN transistors and accompanying integrated circuit structures.

Electromagnetic field (EMF) interference is a crucial concern for sensitive electronic devices, including many radio frequency (RF) devices. Stray or overpowering electromagnetic fields can cause a device to malfunction or even catastrophically fail.

One common way of shielding a device from EMF is through a Faraday cage. A Faraday cage is typically a conductive metal that will absorb incoming EMF, dispersing it throughout the cage, and preventing the EMF from interacting with the internal circuitry. A perfect cage would completely enclose all of the electronic devices. However, for on-chip devices a signal line or power line might extend outside of the cage. The signal line presents a potential problem as being a source for EMF leakage past the protective cage. EMF can interact with this signal line outside of the Faraday cage, and the interference can travel through the signal line, impacting the interior circuitry. This "breach" can be a source of failure in the EMF shielding.

One common way of forming interconnects to Si CMOS integrated circuits is to form copper wire interconnects in dielectric structures. To process copper, the Damascene process (which is subtractive), was developed. In the Cu Damascene process, a host insulator material for the copper, typically an underlying insulating layer (usually silicon dioxide, is patterned with open trenches where the copper is to be formed. A thick coating of copper that significantly overfills the trenches is deposited on the insulating layer, and chemical—mechanical planarization (CMP) is used to remove the excess copper that extends above the top of the insulating layer. Cu filled within the trenches of the insulating layer is not removed and becomes the patterned conductive interconnect. Barrier layers completely surround all copper interconnections, since diffusion of copper into surrounding materials would degrade their properties. Typically, the trenches are lined with thin tantalum (Ta) and/or tantalum nitride (TaN) metal layers (as part of the Ta/TaN/Cu plating seed metal stack) to act as diffusion barriers along the bottom and sides of the Cu metal interconnects. At post Cu CMP the top of the interconnect metal is coated with SiN, to act as the top interface diffusion barrier, to prevent oxidation during interlayer oxide deposition, and to act as a stop etch layer (during the trench etch of the silicon dioxide) for additional interconnect formation. As is known in the art, this is typically not used in the fabrication with compound semiconductors as compound semiconductor fabrication is typically lift-off and gold based.

Photoconductive Semiconductor Switches (PCSS) and photoconductively switched transistors are different devices that offer high voltage switching capabilities, ultra-fast switching speeds, or rapid energy pulses that are switched by light instead of by biases applied by metal gates. As such, they offer the potential for increased operating voltages relative to traditional GaN HEMI switches and RF devices.

What is needed is a compact integration photoconductive semiconductor switch and photo-conductively switched transistors protected by a structure that will shield the electronics from EMF.

SUMMARY

In accordance with the present disclosure, there is provided an EMF shielded integrated circuit structure comprising: a substrate having an upper surface; a semiconductor layer disposed on the upper surface of the substrate; a photoconductive semiconductor switch laterally disposed alongside a transistor on the semiconductor layer integrated into the integrated circuit structure; an EMF shield enclosing the substrate, the semiconductor layer and the photoconductive semiconductor switch laterally disposed alongside the transistor on the semiconductor layer integrated into the integrated circuit structure; and a signal line electronically coupled with the photoconductive semiconductor switch, the signal line penetrating the EMF shield.

A further embodiment of any of the foregoing embodiments may additionally and/or alternatively include the substrate comprises at least one of a silicon material and a silicon carbide material.

A further embodiment of any of the foregoing embodiments may additionally and/or alternatively include the substrate and the semiconductor layer comprise a wafer.

A further embodiment of any of the foregoing embodiments may additionally and/or alternatively include the transistor comprises a field-effect transistor.

A further embodiment of any of the foregoing embodiments may additionally and/or alternatively include the photoconductive semiconductor switch comprises a first electrical contact and a second electrical contact disposed on the GaN layer.

A further embodiment of any of the foregoing embodiments may additionally and/or alternatively include the EMF shield comprises a transitory portion, the transitory portion configured to pass emissions from a light source through the EMF shield to the photoconductive semiconductor switch.

A further embodiment of any of the foregoing embodiments may additionally and/or alternatively include the transitory portion is selected from the group consisting of a mesh, a hole, a transparent material, a translucent material, and combinations thereof.

A further embodiment of any of the foregoing embodiments may additionally and/or alternatively include the EMF shield is configured to prevent EMF radiation from passing through a wall of the EMF shield.

A further embodiment of any of the foregoing embodiments may additionally and/or alternatively include the EMF shielded integrated circuit structure further comprising: a light source optically coupled to the photoconductive semiconductor switch; a controller in electronic communication with the light source, the controller configured to de-activate the light source responsive to EMF radiation detection.

In accordance with the present disclosure, there is provided a laterally integrated circuit with EMF shielding comprising a substrate having an upper surface; a gallium nitride layer disposed on the upper surface of the substrate; a photoconductive semiconductor switch laterally disposed alongside a transistor on the gallium nitride layer integrated into the integrated circuit structure; an EMF shield comprising a container having walls forming an interior and an exterior opposite the interior; the container enclosing the substrate, the gallium nitride layer and the photoconductive semiconductor switch laterally disposed alongside the transistor on the gallium nitride layer integrated into the integrated circuit structure; a signal line electronically coupled with the photoconductive semiconductor switch, the signal line penetrating the wall of the EMF shield container; a light source optically coupled to the photoconductive semiconductor switch; and a transitory portion formed in the wall, the transitory portion configured to pass emissions from the light source through the EMF shield to the photoconductive semiconductor switch.

A further embodiment of any of the foregoing embodiments may additionally and/or alternatively include the integrated circuit structure further comprising a controller in electronic communication with the light source, the controller configured to de-activate the light source responsive to EMF radiation detection.

A further embodiment of any of the foregoing embodiments may additionally and/or alternatively include the integrated circuit structure further comprising an EMF detector in electronic communication with the controller, the EMF detector configured to detect the EMF radiation.

A further embodiment of any of the foregoing embodiments may additionally and/or alternatively include the photoconductive semiconductor switch comprises a first electrical contact and a second electrical contact disposed on the GaN layer.

In accordance with the present disclosure, there is provided a process of protecting a laterally integrated circuit from EMF comprising: enclosing the laterally integrated circuit with an EMF shield; the laterally integrated circuit comprising: a substrate having an upper surface; a semiconductor layer disposed on the upper surface of the substrate; a photoconductive semiconductor switch laterally disposed alongside a transistor on the semiconductor layer integrated into the integrated circuit structure; the EMF shield comprising: a container having walls forming an interior and an exterior opposite the interior; the container enclosing the substrate, the semiconductor layer and the photoconductive semiconductor switch laterally disposed alongside the transistor on the semiconductor layer integrated into the integrated circuit structure, a transitory portion formed in the wall, the transitory portion configured to pass emissions from a light source through the wall to the photoconductive semiconductor switch; coupling a signal line with the photoconductive semiconductor switch, the signal line penetrating the wall of the EMF shield container; and optically coupling the light source to the photoconductive semiconductor switch through the transitory portion.

A further embodiment of any of the foregoing embodiments may additionally and/or alternatively include the process further comprising coupling a controller in electronic communication with the light source, the controller configured to de-activate the light source responsive to EMF radiation detection.

A further embodiment of any of the foregoing embodiments may additionally and/or alternatively include the process further comprising coupling an EMF detector in electronic communication with the controller, the EMF detector configured to detect the EMF radiation.

A further embodiment of any of the foregoing embodiments may additionally and/or alternatively include the process further comprising preventing EMF radiation from passing through the wall of the EMF shield via the signal line responsive to a detection of the EMF radiation.

A further embodiment of any of the foregoing embodiments may additionally and/or alternatively include the photoconductive semiconductor switch comprises a first electrical contact and a second electrical contact disposed on the GaN layer.

A further embodiment of any of the foregoing embodiments may additionally and/or alternatively include the process further comprising activating the photoconductive semiconductor switch responsive to the step of optically coupling the light source to the photoconductive semiconductor switch through the transitory portion.

A further embodiment of any of the foregoing embodiments may additionally and/or alternatively include where the metal interconnects, and EMF shield are formed from copper (Cu) Damascene integration whereby copper traces are embedded in dielectric materials.

A further embodiment of any of the foregoing embodiments may additionally and/or alternatively include where the metal interconnects, and EMF shield are formed from Au based metal interconnects.

A further embodiment of any of the foregoing embodiments may additionally and/or alternatively include where the transistors are formed from elemental semiconductors.

A further embodiment of any of the foregoing embodiments may additionally and/or alternatively include where the transistors are formed from compound semiconductors other than GaN.

A further embodiment of any of the foregoing embodiments may additionally and/or alternatively include where the PCSS is formed from direct bandgap semiconductors other than GaN.

Other details of the EMF shielded integrated circuit with photoconductive semiconductor switch are set forth in the following detailed description and the accompanying drawing wherein like reference numerals depict like elements.

BRIEF DESCRIPTION OF THE DRAWINGS

FIG. 1 is a cross-sectional schematic diagram of an exemplary laterally integrated circuit structure with Faraday cage.

DETAILED DESCRIPTION

Referring to FIG. 1, there is illustrated a laterally integrated circuit structure 10. The laterally integrated circuit structure 10 includes a transistor 12 electrically coupled with a PCSS 14 each laterally integrated and supported on a common substrate 16. The transistor 12 can be an elemental or compound semiconductor field effect transistor (FET), here for example; silicon (Si) complementary metal oxide semiconductor (CMOS) transistors, gallium nitride (GaN), indium-phosphide (InP) based transistors, gallium arsenide (GaAs), and silicon carbide (SiC) and accompanying integrated circuit structures. The PCSS 14 can include a direct bandgap compound semiconductor PCSS; here for example GaN, GaAs, or InP. The substrate 16 can include an elemental or compound semiconductor; here for example silicon Si or SiC or GaAs or GaN or InP material. We note that for many applications indirect bandgap substrates such as Si or SiC may be preferable to limit confine the activation of carriers to the PCSS 14. Alternately the generation of carriers in the substrate 16 can be limited by utilizing a substrate with a bandgap larger than that of the light source 32. The substrate 16 includes an upper surface 18.

In an exemplary embodiment a gallium nitride (GaN) layer 20 is disposed on the upper surface 18 of the substrate 16 to form a GaN on Si wafer 22. The GaN layer 20 supports the transistor 12 and the PCSS 14 in tandem such that the transistor 12 and PCSS 14 are laterally integrated and incorporated in the same integrated circuit. The exemplary GaN embodiment and additional exemplary alternate embodiments; which can be formed from a variety of materials as discussed previously, will be discussed in the following paragraphs.

The FET 12 includes an aluminum gallium nitride (AlGaN) layer 24 disposed on the GaN layer 20. The FET 12 includes silicon nitride dielectric (SiN/dielectric) layer 26 disposed on the AlGaN layer 24 proximate each of the drain D, gate G and source S of the FET 12. A silicon dioxide dielectric ($SiO_2$/dielectric) layer 28 insulates the transistor 12 circuitry as well as an interlayer 30, here for example SiNx, and conductive interconnects 31 disposed within the silicon dioxide dielectric layer 28. The dielectrics 28, 26 and interlayer 30 can be transparent to a light source 32 utilized to trigger the PCSS 14 conduction path. In an exemplary embodiment, in the event of the dielectric or interlayer not being transparent, a window can be opened in the films to allow for light transmission.

The PCSS 14 can include a first electrical contact 34 (PCSS-1) and a second electrical contact 36 (PCSS-2) disposed on the GaN layer 20. In an exemplary embodiment, the silicon dioxide dielectric layer 28 insulates each of the first electrical contact 34 and second electrical contact 36 of the photoconductive semiconductor switch 14. In exemplary embodiments, the dielectric layer 28 can be silicon nitride, or silicon dioxide material, and the like. In other exemplary embodiments, the first electrical contact 34 and second electrical contact 36 do not have dielectric insulation. A photoconductive semiconductor switch 14 is a region of semiconductor material (such as GaN) that is normally very highly resistive, here for example unintentionally doped or doped with a deep level such as carbon or iron. This allows the material to block a substantial amount of voltage with very low leakage. However, when illuminated with a light source 32 that has an energy above or near the band gap energy, a plethora of excited carriers are generated. These excited carriers now form a low-resistance conduction path used for switching. The PCSS 14 offers high voltage switching capabilities, ultra-fast switching speeds, or rapid energy pulses. An input voltage to the transistor 12 can be controlled by the on-off state of the PCSS 14 or the other way around.

A Faraday cage or EMF shield 40 is disposed around the laterally integrated circuit 10. The EMF shield 40 can surround the laterally integrated circuit 10, such that an electric field, and EMF radiation 42 is not able to penetrate the EMF shield 40 to negatively impact the laterally integrated circuit 10. The EMF shield 40 can be a container 44 defining an interior 46 and exterior 48. The EMF shield 40 can be made of conductive material, such as wire mesh, metal plates, and the like, configured to prevent the EMF radiation 42 from passing through the container 44. The EMF shield 40 is configured to protect the laterally integrated circuit 10 from external electric fields/EMF radiation 42. The EMF shield 40 can be used to prevent external electromagnetic interference (EMI), or electrical noise from interfering with the laterally integrated circuit 10. The EMF shield 40 includes a transitory portion 50 optically coupled to the light source 32. The transitory portion 50 is configured to allow the light source 32 emission 52 to pass through the EMF shield 40 to trigger the PCSS 14. The transitory portion 50 can include holes, slots, physical penetrations, transparent/translucent materials and the like, in a wall 54 of the container 44 of the EMF shield 40 that can allow the emission 52 to pass through the EMF shield 40.

A signal line 56 is electrically coupled with the PCSS 14. The signal line 56 can be in series with the PCSS 14 and an exterior circuit 58. The signal line 56 penetrates the wall 54 of the EMF shield 40. The signal line 56 is configured to transmit signals from the exterior circuit 58 outside the laterally integrated circuit 10 across the EMF shield 40 and into the PCSS 14 and to be passed through the PCSS 14 when the PCSS 14 is activated. When the PCSS 14 is not activated, the signal line 56 is isolated from passing any signal or even EMF radiation 42 across the EMF shield 40, thus preventing any EMF radiation 42 from interfering with the laterally integrated circuit 10.

It is noted that the EMF shield 40, conductive interconnects 31, and single line 56 can be Cu Damascene or gold based. The Cu Damascene process embodiment has the advantage of being planar process with the Cu metal traces embedded in dielectric. This in turn enables additional Cu layers to be added sequentially thereby enabling complex EMF shield 40 conductive interconnects 31 with vertical and horizontal elements to be formed. Other embodiments may include gold based interconnects and EMF shields formed by liftoff of electron-beam deposited metals and/or plating with EMF shields formed by metal deposition into dielectric trenches, air bridge-like structures, or by bonding of EMF shields with cavities over the PCSS containing integrated circuit The arrangement of the EMF shield 40 coupled with the PCSS 14 and signal line 56 also prevent any EMF radiation 42 from being emitted from the laterally integrated circuit 10 to the outside of the EMF shield 40, thus protecting any other circuitry from emissions from the laterally integrated circuit 10.

In an exemplary embodiment, a controller 60 can be in electronic communication with the light source 32. The controller 60 can include processor 62 for automatic actuation of the light source 32. The light source controller 60 can include one or more processors 62 (e.g., computer systems having a central processing unit and memory) for recording, processing and storing the data received. The processor 62 may include a general-purpose processor, a digital signal processor (DSP), an application specific integrated circuit (ASIC), a field programmable gate array (FPGA) or other programmable logic device, discrete gate or transistor logic, discrete hardware components, or any combination thereof. An EMF detector 64 can be in in electronic communication with the controller 60. The EMF detector 64 can be configured to detect EMF radiation 42. The controller 60 can be configured to prevent activation of the light source 32 upon detection of the EMF radiation 42 in order to prevent the inadvertent activation of the PCSS 14 allowing unwanted EMF radiation 42 from transmitting along the signal line 54 and into the laterally integrated circuit 10.

The light source 32 can be external to the overall integrated circuit structure 10 or may be located in an upper layer of the planar Cu damascene structure of the embodiment as Cu damascene enables die to wafer bonding or wafer to wafer bonding of materials and devices or a combination thereof into the upper layers of the structure that are subsequently further connected with additional Cu conductive interconnects to control circuitry.

A technical advantage of the disclosure includes integration of optically gated switches directly with the GaN on Si process flow to enable intrinsic high voltage capabilities and rapid response times of optically gated switches while preventing unwanted EMF radiation.

Another technical advantage of the disclosure includes a structure that will protect an integrated circuit from EMF that includes a highly resistive PCSS in series with the signal/power line to prevent stray signals from outside of a Faraday cage from interfering with the internal integrated circuit.

Another technical advantage of the disclosure includes a structure that includes a Faraday cage enclosing an integrated circuit with photoconductive semiconductor switch.

Another technical advantage of the disclosure includes a PCSS device that controls, or is controlled by, a GaN plus Si device homogenously integrated in the same wafer.

Another technical advantage of the disclosure includes a structure that has a Faraday cage material that is transparent to emissions needed to control the PCSS, but will protect from EMF in wavelengths that will be damaging to the integrated circuit.

Another technical advantage of the disclosure includes a PCSS device that relays the signal to a local FET/integrated circuit.

Another technical advantage of the disclosure includes fabricating the GaN PCSS can be layer-subtraction based, utilizing techniques traditional to Si foundries.

Another technical advantage of the disclosure includes both GaN PCSS and GaN/Si transistors are fabricated at the same time using the same processing steps.

Another technical advantage of the disclosure includes adding PCSS to a GaN on a Si device which is a nontrivial addition, as it utilizes layers and structure that would not be used in a standalone GaN on Si or standalone PCSS device.

Another technical advantage of the disclosure includes a structure that can work with a wide variety of integrated circuits or FET applications.

Another technical advantage of the disclosure is that the use of Cu damascene enables 3D integration of multiple tiers of light sources, transistors and PCSS within a fabricated wafer cross section. As such there may be multiple layers containing EMF shielded circuits that can communicate to other EMF shielded circuits. Alternately one or more unshielded region(s) may communicate to one or more shielded region(s) and/or to one or more external light sources and detectors.

There has been provided an EMF shielded integrated circuit with photoconductive semiconductor switch. While the an EMF shielded integrated circuit with photoconductive semiconductor switch has been described in the context of specific embodiments thereof, other unforeseen alternatives, modifications, and variations may become apparent to those skilled in the art having read the foregoing description. Accordingly, it is intended to embrace those alternatives, modifications, and variations which fall within the broad scope of the appended claims.

What is claimed is:

1. An electromagnetic field (EMF) shielded integrated circuit structure comprising:
   a substrate having an upper surface;
   a semiconductor layer disposed on said upper surface of the substrate;
   a photoconductive semiconductor switch laterally disposed alongside a transistor on said semiconductor layer integrated into the EMF shielded integrated circuit structure;
   an EMF shield enclosing said substrate, said semiconductor layer and said photoconductive semiconductor switch laterally disposed alongside the transistor on said semiconductor layer integrated into the EMF shielded integrated circuit structure; and
   a signal line electronically coupled with said photoconductive semiconductor switch, said signal line penetrating said EMF shield.

2. The EMF shielded integrated circuit structure according to claim 1, wherein said substrate comprises at least one of a silicon material and a silicon carbide material.

3. The EMF shielded integrated circuit structure according to claim 1, wherein said substrate and said semiconductor layer comprise a wafer.

4. The EMF shielded integrated circuit structure according to claim 1, wherein said transistor comprises a field-effect transistor.

5. The EMF shielded integrated circuit structure according to claim 1, wherein said photoconductive semiconductor switch comprises a first electrical contact and a second electrical contact disposed on the semiconductor layer.

6. The EMF shielded integrated circuit structure according to claim 1, wherein said EMF shield comprises a transitory portion, said transitory portion configured to pass emissions from a light source through said EMF shield to said photoconductive semiconductor switch.

7. The EMF shielded integrated circuit structure according to claim 6, wherein said transitory portion is selected from the group consisting of a mesh, a hole, a transparent material, a translucent material, and combinations thereof.

8. The EMF shielded integrated circuit structure according to claim 1, wherein said EMF shield is configured to prevent EMF radiation from passing through a wall of said EMF shield.

9. The EMF shielded integrated circuit structure according to claim 1, further comprising:
   a light source optically coupled to said photoconductive semiconductor switch;
   a controller in an electronic communication with said light source, said controller configured to de-activate said light source responsive to EMF radiation detection.

10. A laterally integrated circuit with electromagnetic field (EMF) shielding comprising:
    a substrate having an upper surface;
    a gallium nitride (GaN) layer disposed on said upper surface of the substrate;
    a photoconductive semiconductor switch laterally disposed alongside a transistor on said gallium nitride layer integrated into an integrated circuit structure;
    an EMF shield comprising a container having walls forming an interior and an exterior opposite said interior;
    said container enclosing said substrate, said gallium nitride layer and said photoconductive semiconductor switch laterally disposed alongside the transistor on said gallium nitride layer integrated into the integrated circuit structure;
    a signal line electronically coupled with said photoconductive semiconductor switch, said signal line penetrating one of said walls of the EMF shield container;
    a light source optically coupled to said photoconductive semiconductor switch; and
    a transitory portion formed in one of said walls, said transitory portion configured to pass emissions from the light source through said EMF shield to said photoconductive semiconductor switch.

11. The laterally integrated circuit with the EMF shielding according to claim 10, further comprising:
a controller in an electronic communication with said light source, said controller configured to de-activate said light source responsive to an EMF radiation detection.

12. The laterally integrated circuit with the EMF shielding according to claim 11, further comprising:
an EMF detector in the electronic communication with the controller, the EMF detector configured to detect the EMF radiation detection.

13. The laterally integrated circuit with the EMF shielding according to claim 10, wherein said photoconductive semiconductor switch comprises a first electrical contact and a second electrical contact disposed on the GaN layer.

14. A process of protecting a laterally integrated circuit from electromagnetic field (EMF) comprising:
enclosing the laterally integrated circuit with an EMF shield; said laterally integrated circuit comprising:
a substrate having an upper surface;
a semiconductor layer disposed on said upper surface of the substrate;
a photoconductive semiconductor switch laterally disposed alongside a transistor on said semiconductor layer integrated into the laterally integrated circuit;
said EMF shield comprising:
a container having walls forming an interior and an exterior opposite to said interior;
said container enclosing said substrate, said semiconductor layer and said photoconductive semiconductor switch laterally disposed alongside the transistor on said semiconductor layer integrated into the laterally integrated circuit, a transitory portion formed in one of said walls, said transitory portion configured to pass emissions from a light source through one of said walls to said photoconductive semiconductor switch;
coupling a signal line with said photoconductive semiconductor switch, said signal line penetrating one of said walls of the EMF shield container; and
optically coupling the light source to said photoconductive semiconductor switch.

15. The process of protecting the laterally integrated circuit from EMF according to claim 14, further comprising:
coupling a controller in electronic communication with said light source, said controller configured to de-activate said light source responsive to an EMF radiation detection.

16. The process of protecting the laterally integrated circuit from EMF according to claim 15, further comprising:
coupling an EMF detector in the electronic communication with the controller, the EMF detector configured to detect the EMF radiation detection.

17. The process of protecting the laterally integrated circuit from EMF according to claim 16, further comprising:
Preventing an EMF radiation from passing through the walls of said EMF shield via said signal line responsive to a detection of said EMF radiation.

18. The process of protecting the laterally integrated circuit from EMF according to claim 14, wherein said photoconductive semiconductor switch comprises a first electrical contact and a second electrical contact disposed on the GaN layer.

19. The process of protecting the laterally integrated circuit from EMF according to claim 14, further comprising:
activating said photoconductive semiconductor switch responsive to optically coupling the light source to said photoconductive semiconductor switch through said transitory portion.

* * * * *